United States Patent
Tien

(10) Patent No.: US 6,642,761 B1
(45) Date of Patent: Nov. 4, 2003

(54) INTERFACE CIRCUIT OF VARIOUS CLOCK PERIOD BETWEEN A FAST SLOPE SIGNAL AND A VERY SLOW SLOPE, VOLTAGE CONTROLLED DELAY CELL

(75) Inventor: Li-Chin Tien, Taipei (TW)

(73) Assignee: Etron Technology, Inc., Hsin-Chu (TW)

( * ) Notice: Subject to any disclaimer, the term of this patent is extended or adjusted under 35 U.S.C. 154(b) by 0 days.

(21) Appl. No.: 10/158,466

(22) Filed: May 30, 2002

(51) Int. Cl.[7] .................................................. H03L 7/06
(52) U.S. Cl. ........................ 327/158; 327/161; 327/274; 327/287; 375/376; 331/DIG. 2
(58) Field of Search ................................. 327/263, 264, 327/266, 269–271, 274, 276, 284, 285, 287, 288, 149, 153, 158, 161; 375/373–376; 331/DIG. 2, 1 A

(56) References Cited

U.S. PATENT DOCUMENTS

| | | | |
|---|---|---|---|
| 5,012,142 A | * | 4/1991 | Sonntag ........................ 327/261 |
| 5,731,727 A | * | 3/1998 | Iwamoto et al. ............. 327/281 |
| 5,869,992 A | * | 2/1999 | Sekino ......................... 327/276 |
| 6,137,327 A | | 10/2000 | Schnell ........................ 327/158 |
| 6,150,856 A | | 11/2000 | Morzano ..................... 327/149 |
| 6,229,368 B1 | | 5/2001 | Lee .............................. 327/292 |
| 6,407,601 B1 | * | 6/2002 | Lin .............................. 327/158 |

\* cited by examiner

*Primary Examiner*—Minh Nguyen
(74) *Attorney, Agent, or Firm*—George O. Saile; Stephen B. Ackerman; Douglas R. Schnabel

(57) ABSTRACT

A particular wide band interface circuit provides an interface between a very fast slope clock signal input and a very slow slope voltage controlled delay cell of a delay lock loop. The invention generates the internal clock signal to track the slope of each delay stage, whether it is a higher frequency for which the slope of the delay stage is faster or a lower frequency for which the slope of the delay stage is slower. The integrated circuit includes a voltage bias portion, an analog clock input portion, circuit devices for interfacing with clock frequency inputs over all the available frequency range, and an output portion for producing clock signals. The invention applies to the multiple delay stages of a delay lock loop.

17 Claims, 4 Drawing Sheets

INTERFACE CIRCUIT OF VARIOUS CLOCK PERIOD BETWEEN A FAST SLOPE SIGNAL AND A VERY SLOW SLOPE, VOLTAGE CONTROLLED DELAY CELL

BACKGROUND OF THE INVENTION

1. Field of the Invention

The present invention generally relates to an integrated circuit of a semiconductor memory, and more particularly to an interface circuit between a clock input signal and delay cells of a delay lock loop.

2. Description of the Prior Art

Major design efforts have been directed at circuit design techniques involving clock input signals and voltage controlled delay lock loop (DLL) circuits.

A number of solutions have been proposed.

U.S. Pat. No. 6,137,327 (Schnell) describes a delay lock loop circuit, which includes a receiver for receiving a system clock signal. Its output is a first clock signal derived from the system clock signal. It includes a delay lock loop for receiving the first clock signal, which synchronizes the delay lock loop. It also includes a phase detector and an off chip driver circuit for receiving the first clock signal. Its data output is in accordance with a second clock signal derived from the first. There is a feedback loop which couples the off chip driver to the phase detector. This loop includes an on chip delay circuit and a package delay circuit, both used for modeling purposes. The system clock signal is synchronized with the off chip driver output by means of the feedback loop.

U.S. Pat. No. 6,150,856 (Morzano) discloses delay lock loops, signal-locking methods, and methods of implementing delay lock loops. There is discussion of a delay lock loop comprised of a delay line having two inputs, a clock signal and an input coupled to the delay line output, and an output clock signal, set by the delay lock loop. There is also a phase detector whose output is coupled with the input of the delay line. Delay elements are configured to provide additional delay to the phase detector.

U.S. Pat. No. 6,229,368 (Lee) shows an integrated circuit for generating local clock signals with no phase difference from an internal clock signal. It also shows an internal clock generating circuit, which generates a signal with reduced sensitivity to process, temperature, voltage, and noise. The generating circuit for the local clock signals includes several phase blenders. The internal clock generating circuit includes a feedback circuit and a delay lock loop circuit. The feedback circuit generates a feedback clock signal. The delay lock circuit receives this signal, as well as an external clock signal, and generates the internal clock.

There is further need to improve the performance of semiconductor memory devices by providing operation at different clock frequencies, specifically by which an integrated circuit can generate an internal clock signal from a fast slope clock input, to be used as an input to the low frequency operation of a delay cell, in a delay lock loop.

SUMMARY OF THE INVENTION

It is therefore an object of the present invention to provide a wide band interface circuit between a very fast slope clock signal input and a very slow slope voltage controlled delay cell of a delay lock loop, while keeping the same amplitude when the slope is changed.

It is a further object of the invention to provide a means for generating the internal clock signal to track the slope of each delay stage, whether it is at a higher frequency for which the slope of the delay stage is faster or at a lower frequency for which the slope of the delay stage is slower.

These and other objects are achieved by an integrated circuit that includes: a voltage bias portion for PMOS VBP and NMOS VBN; an analog clock input portion for clock signals IP and IN; circuit devices for interfacing with different clock frequency inputs (N31, N32 and P31, P32); and an output portion for producing clock signals ON and OP. Furthermore, the invention may be used to change the slope of the input signal of a delay lock loop, where multiple delay stages are used and the delay of each stage is varied.

BRIEF DESCRIPTION OF THE DRAWINGS

The foregoing and other objects, aspects, and advantages will be better understood from the following detailed description of a preferred embodiment of the invention, with reference to the drawings, in which.

DESCRIPTION OF THE PREFERRED EMBODIMENT

One embodiment of the present invention is provided below with reference to the accompanying diagrams in which like reference numbers and symbols identify like, elements throughout.

Figure 1:
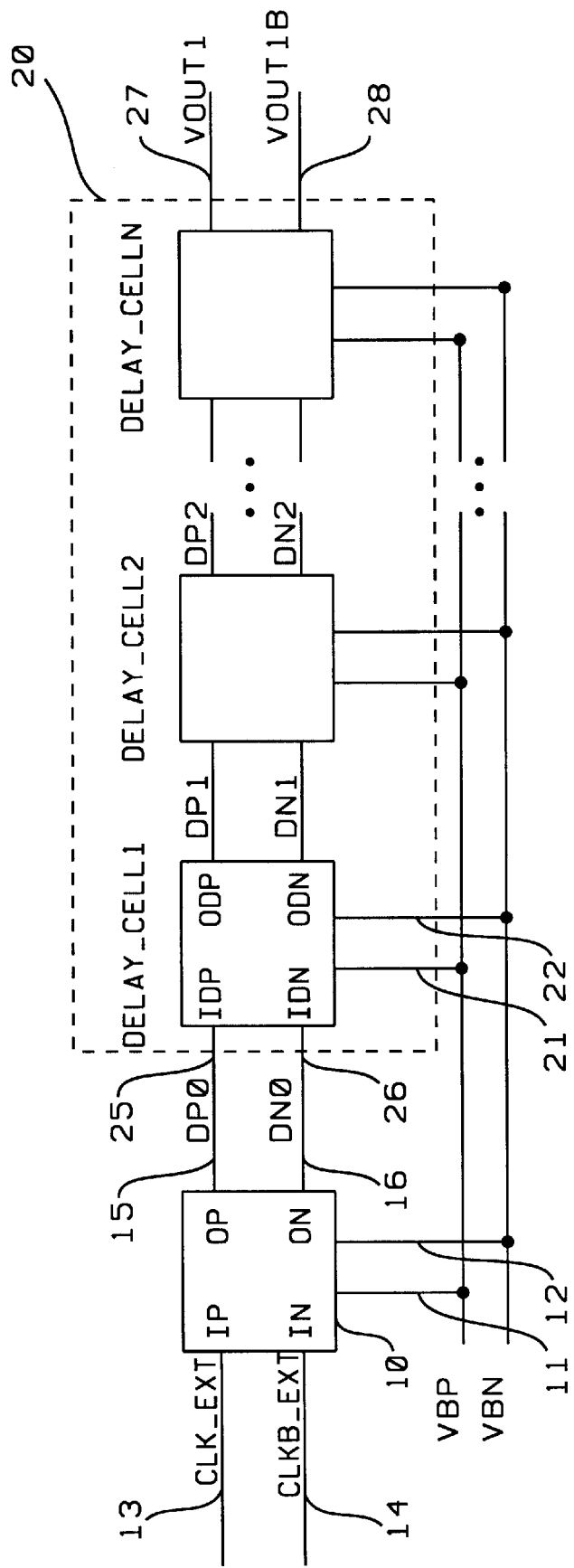
FIG. 1 is a block diagram of a portion of a clock buffered interface in accordance with the present invention.

Referring to FIG. 1, a portion of a clock buffered interface in accordance with the present invention is shown. The voltage control delay line VCDL at 10 comprises a circuit having first, second, third, and fourth inputs, 11, 12, 13, and 14, and first and second outputs, 15 and 16. First and second inputs, 11 and 12, are configured to receive voltage bias VBP and VBN, for PMOS and NMOS devices respectively. Third and fourth inputs, 13 and 14, are configured to receive analog clock signals IP (CLK_EXT) and IN (CLKB_EXT), respectively. First and second outputs, 15 and 16, produce clock signals OP (DP0) and ON (DN0), with modified slope to track the slope of the delay cell, whether it is at a higher frequency for which the slope of the delay stage is faster or at a lower frequency for which the slope of the delay stage is slower.

The DELAY_CELL at 20 comprises several circuits. DELAY_CELL1 has first and second inputs, 21 and 22, operably coupled with 11 and 12, of the invention. Third and fourth inputs, 25 and 26, are configured to receive outputs OP (DP0) and ON (DN0), of the invention. First and second outputs of DELAY_CELL1 produce clock signals ODP (DP1) and ODN (DN1). DELAY_CELL2 has first and second inputs operably coupled with 11 and 12 of the invention, and third and fourth inputs configured to receive outputs DP1 and DN1. DELAY_CELL2 produces first and second outputs DP2 and DN2. DELAY_CELL_N has first and second inputs operably coupled with 11 and 12 of the invention, and third and fourth inputs configured to receive outputs DPN-1 and DNN-1. DELAY_CELLN produces first and second outputs DPN (VOUT1) and DNN (VOUT1B).

Figure 2:
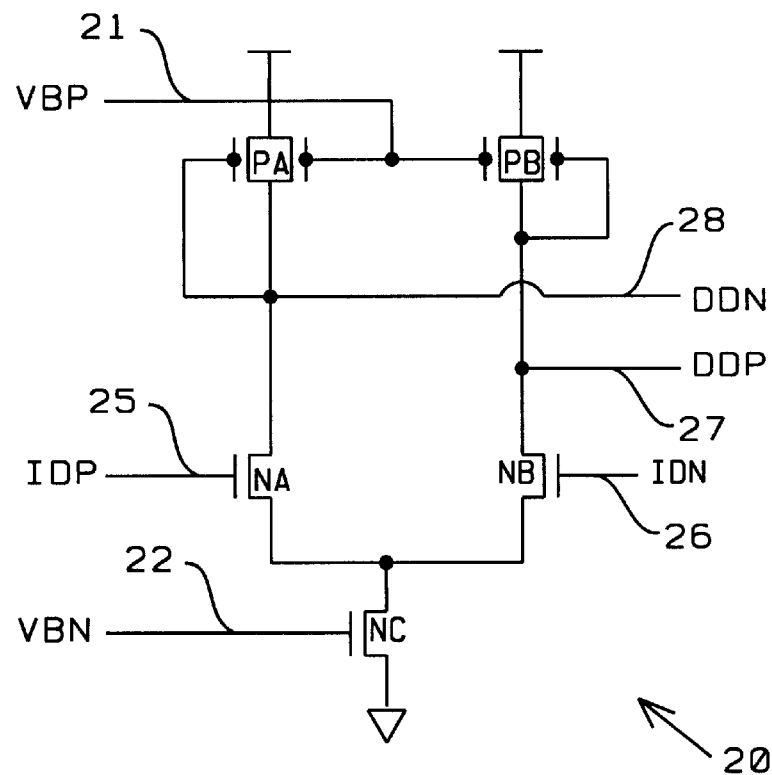
FIG. 2 is a circuit diagram of one delay cell of both the prior art and the present invention.

With reference to FIG. 2, DELAY_CELL1 is shown. DELAY_CELL1 is comprised of: input 21 connected to PMOS voltage bias VBP; input 22 connected to NMOS voltage bias VBN; input 25 connected to clock signal IDP (DP0) from the invention; input 26 connected to clock signal IDN (DN0) from the invention; first output producing clock signal ODP (DP1); and second output producing clock signal ODN (DN1). It should be noted that VBP is applied to the gate nodes of PMOS transistors PA and PB, VBN is applied to the gate node of NMOS transistor NC, IDP is applied to the gate of NMOS transistor NA, and IDN is applied to the gate of NMOS transistor NB. It should also be noted that ODP is a common node for the gate and drain of PB and the drain of NB, and that ODN is a common node for the gate and drain of PA and the drain of NA. The invention applies to a delay lock loop that includes one or more of said delay cells.

Figure 3:
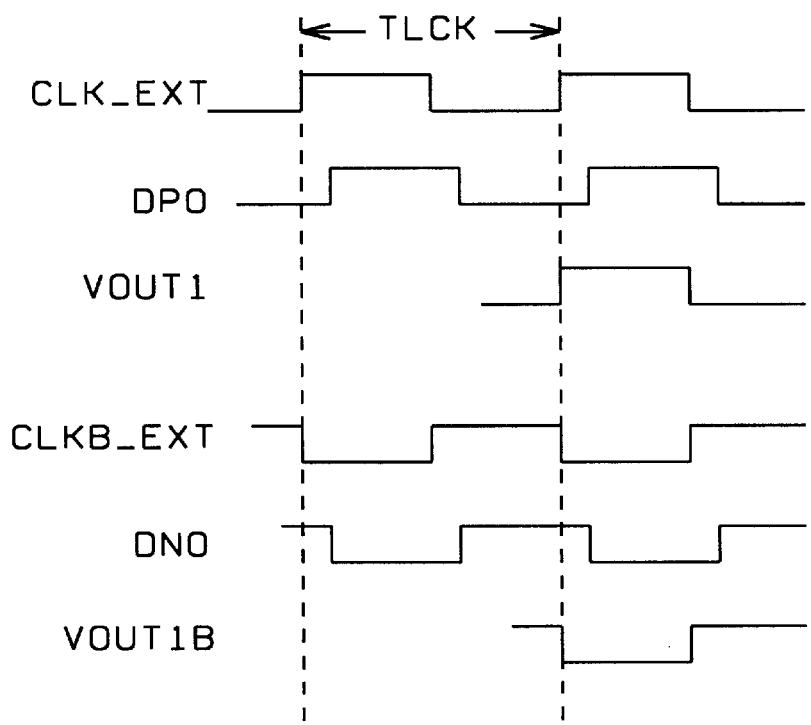
FIG. 3 is a timing diagram showing the operation of the circuits of FIGS. 1 and 2.

FIG. 3 is a diagram of timed operation showing the external clock signal CLK_EXT, clock signal output DP0 of the proposed invention, and clock signal output VOUT1 of the delay cell circuitry, for PMOS devices, and the clock signals CLKB_EXT, DN0, and VOUT1B, for NMOS devices. It should be noted that the clock signal outputs of the proposed invention need to be aligned with the external clock signals, by means of the delay cell circuitry.

Figure 4:
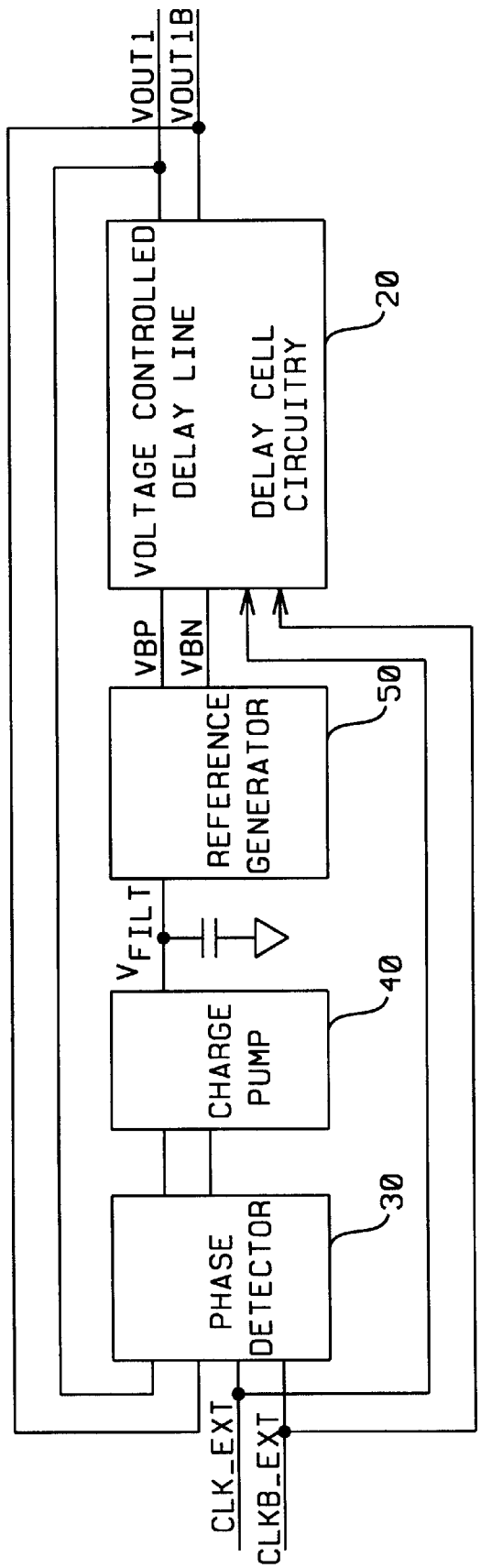
FIG. 4 is a high level schematic of a delay lock loop circuit illustrating the improvement provided by the present invention.

The delay lock loop illustrated in FIG. 4 includes a phase detector 30, a charge pump 40, a reference generator 50, the proposed invention voltage control delay line VCDL 10, and delay cell circuitry 20. The phase detector 30 compares the phase of the external clock signal CLK_EXT and CLKB_EXT to the phase of the output signal VOUT1 and VOUT1B of the delay cell circuitry and detects the phase difference between the signals. The delay cell circuitry controls the delay time in response to the output of the phase detector 30. The charge pump 40 and the reference generator 50 work to generate the PMOS voltage bias VBP and the NMOS voltage bias VBN. The proposed invention VCDL preserves the clock signal VCC swing without distortion and allows its transitional slope to propagate. The delay cell circuitry modifies the clock signal swing and aligns it with the external clock signals.

Figure 5B:
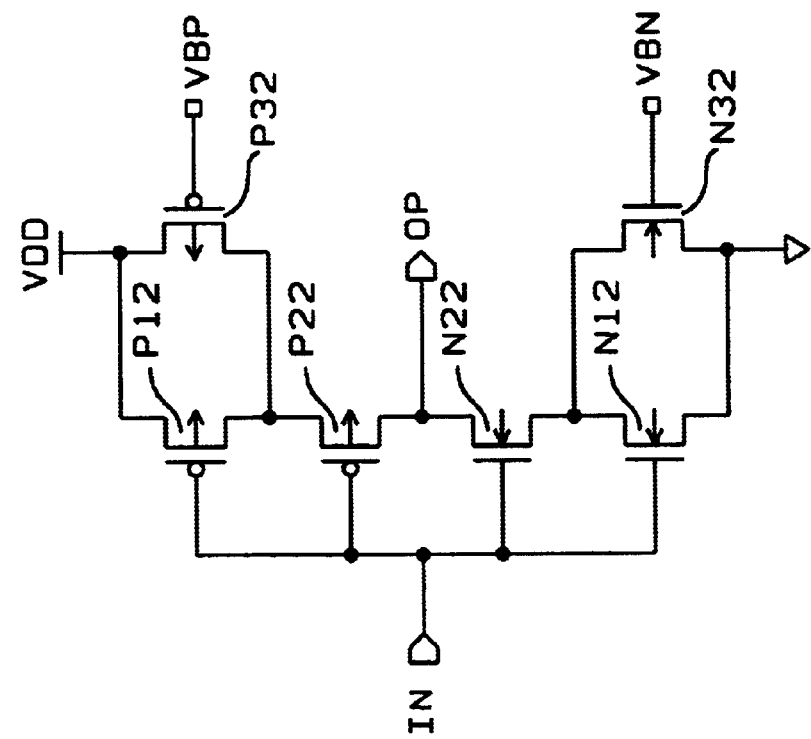
FIGS. 5a & 5b is an electrical schematic of the voltage control delay line VCDL in accordance with the present invention.
Figure 5A:
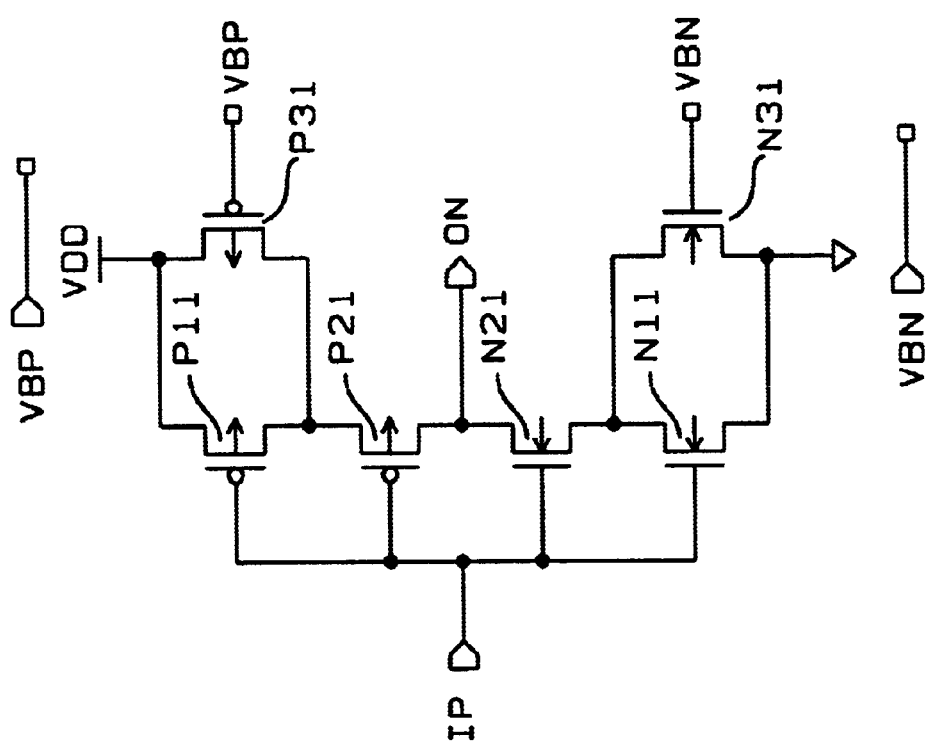

With reference to FIGS. 5a and 5b, an electrical schematic of the present invention voltage control delay line VCDL is shown. VCDL is comprised of a voltage bias portion for PMOS VBP and NMOS VBN; an analog clock input portion for clock signals IP and IN; circuit devices for interfacing with different clock frequency inputs (N31, N32 and P31, P32); and an output portion for producing clock signals ON and OP. The voltage bias VBP is applied to the gate nodes of PMOS transistors P31 and P32, and the voltage bias VBN is applied to the gate nodes of NMOS transistors N31 and N32. The external analog clock signal IP is applied to the gates of N11, N21, P21, P11 and IN is applied to the gates of N12, N22, P22, P12 respectively.

With continued reference to FIGS. 5a and 5b, the operation of VCDL is as follows. Devices P21, N21 and P22, N22 are controlled by external clock signals IP and IN respectively. At higher frequencies, VBP and VBN cause devices P31, P32 and N31, N32 to turn on strongly. The amount of current in these devices is high, and determines the discharge rate (slope) of outputs ON and OP to be fast. At lower frequencies, devices P31, P32 and N31, N32 turn on weakly and determine the discharge rate (slope) of outputs ON and OP to be slow. The sizes of N11, N12 and P11, P12 are small comparatively, and help ON and OP track the delay cell slope at these frequencies.

While the invention has been described in terms of the preferred embodiment, those skilled in the art will recognize that various changes in form and details may be made without departing from the spirit and scope of the invention. The present invention covers modifications that fall within the range of the appended claims and their equivalents.

What is claimed is:

1. A method of implementing a delay lock loop comprising:
   providing a phase detector having first inputs coupled with external clock signals and second inputs coupled with the outputs of a delay cell circuitry;
   providing a charge pump having inputs coupled with the outputs of the phase detector;
   providing a reference generator having an input operably coupled with the output of the charge pump;
   providing a voltage control delay line circuit having first inputs coupled with the outputs of the reference generator and second inputs coupled with the external clock signals; and
   providing said delay cell circuitry having first inputs coupled with the outputs of the voltage control delay line circuit and second inputs coupled with the outputs of the reference generator.

2. The method of claim 1, wherein the step of providing of the delay cell circuitry comprises configuring said delay cell circuitry to provide respective delay to align clock signals output from the delay cell circuitry with the external clock signals of the delay lock loop.

3. The method of claim 1, wherein the step of providing the voltage control delay line circuit comprises configuring said voltage control delay line circuit to provide respective interface for multiple delay stages where the delay of each stage is varied for the delay lock loop.

4. The method of claim 1, wherein the step of providing the voltage control delay line circuit comprises configuring said voltage control delay line circuit to provide clock signals output with the same VCC swing as the external clock signals input with regards to all available frequency range.

5. A clock buffered interface circuit comprising:
   a voltage controlled delay line cell having a differential clock input, having a p-channel bias input, having an n-channel bias input, and generating a differential clock output, wherein said differential clock output has a modified slope of said differential clock input based on said p-channel and n-channel bias inputs; and
   a delay cell having a delay cell differential clock input, having a p-channel bias delay cell input, having an n-channel bias delay cell input, and generating a differential clock delay cell output, wherein said differential clock delay cell output is a delayed version of said differential clock delay cell input based on said p-channel and n-channel bias delay cell inputs, wherein said differential clock delay cell input is coupled to said voltage controlled delay line cell differential clock output, and wherein said delay cell further comprises:
   a first n-channel transistor with gate coupled to a first polarity of said delay cell differential clock input and drain coupled to a first polarity of said delay cell differential clock output;
   a second n-channel transistor with gate coupled to a second polarity of said delay cell differential clock input and drain coupled to a second polarity of said delay cell differential clock output;

a third n-channel transistor with gate coupled to said n-channel bias input, source coupled to ground, and drain coupled to sources of said first and second n-channel transistors;

a first p-channel transistor with gate coupled to said p-channel bias input, drain coupled to said first polarity of said delay cell differential clock output, and source coupled to a power supply; and a second p-channel transistor with gate coupled to said p-channel bias input, drain coupled to said second polarity of said delay cell differential clock output, and source coupled to said power supply.

6. The circuit according to claim 5 wherein said delay cell further comprises:

a third p-channel transistor with gate and drain coupled to said first polarity of said delay cell differential clock output and source coupled to said power supply; and a fourth p-channel transistor with gate and drain coupled to said second polarity of said delay cell differential clock output and source coupled to said power supply.

7. The circuit according to claim 5 wherein said voltage controlled delay line cell further comprises first and second inverters each having an input coupled to a first polarity of said voltage controlled delay line cell differential clock input and each generating an output coupled to a first polarity of said voltage controlled delay line cell differential clock output wherein each said inverter further comprises:

a first n-channel transistor with gate coupled to said inverter input and drain coupled to said inverter output;

a second n-channel transistor with gate coupled to said inverter input, drain coupled to source of said first n-channel transistor, and source coupled to ground;

a third n-channel transistor with gate coupled to said voltage controlled delay line cell n-channel bias input, drain coupled to said source of said first n-channel transistor, and source coupled to said ground;

a first p-channel transistor with gate coupled to said inverter input and drain coupled to said inverter output;

a second p-channel transistor with gate coupled to said inverter input, drain coupled to source of said first p-channel transistor, and source coupled to a power supply; and a third p-channel transistor with gate coupled to said voltage controlled delay line cell p-channel bias input, drain coupled to said source of said first p-channel transistor, and source coupled to said power supply.

8. The circuit according to claim 5 wherein said voltage controlled delay line cell channel bias input and said delay cell p-channel bias input are the same signal.

9. The circuit according to claim 5 wherein said voltage controlled delay line cell n-channel bias input and said delay cell n-channel bias input are the same signal.

10. The circuit according to claim 5 further comprising additional said delay cells.

11. A delay lock loop circuit having an input coupled to a differential input clock signal and generating an output differential clock signal wherein said delay lock loop circuit comprises:

a phase detector having a first input coupled to said delay lock loop differential input clock signal, having a second input, and generating an output;

a charge pump having an input coupled to said phase detector output and generating an output;

a reference generator having an input coupled to said charge pump output, generating a p-channel bias, and generating an n-channel bias; and a clock buffered interface circuit comprising:

a voltage controlled delay line cell having a differential clock input coupled to said delay lock loop differential input clock signal, having a p-channel bias input coupled to said reference generator p-channel bias, having an n-channel bias input coupled to said reference generator n-channel bias, and generating a differential clock output, wherein said differential clock output has a modified slope of said differential clock input based on said p-channel and n-channel bias inputs; and a delay cell having a delay cell differential clock input, p-channel bias delay cell input, n-channel bias delay cell input, and generating a delay cell differential clock output, wherein said delay cell differential clock output is a delayed version of said delay cell differential clock input based on said p-channel and n-channel bias delay cell inputs, wherein said delay cell differential clock input is coupled to said voltage controlled delay line cell differential clock output, and wherein said delay cell differential clock output is coupled to said phase detector second input.

12. The circuit according to claim 11 wherein said delay cell further comprises:

a first n-channel transistor with gate coupled to a first polarity of said delay cell differential clock input and drain coupled to a first polarity of said delay cell differential clock output;

a second n-channel transistor with gate coupled to a second polarity of said delay cell differential clock input and drain coupled to a second polarity of said delay cell differential clock output;

a third n-channel transistor with gate coupled to said n-channel bias input, source coupled to ground, and drain coupled to sources of said first and second n-channel transistors;

a first p-channel transistor with gate coupled to said p-channel bias input, drain coupled to said first polarity of said delay cell differential clock output, and source coupled to a power supply; and a second p-channel transistor with gate coupled to said p-channel bias input, drain coupled to said second polarity of said delay cell differential clock output, and source coupled to said power supply.

13. The circuit according to claim 11 wherein said delay cell further comprises:

a third p-channel transistor with gate and drain coupled to said first polarity of said delay cell differential clock output and source coupled to a power supply; and a fourth p-channel transistor with gate and drain coupled to said first polarity of said delay cell differential clock output and source coupled to said power supply.

14. The circuit according to claim 11 wherein said voltage controlled delay line cell further comprises first and second inverters each having an input coupled to a first polarity of said voltage controlled delay line cell differential clock input and each generating an output coupled to a first polarity of said voltage controlled delay line cell differential clock output wherein each said inverter further comprises:

a first n-channel transistor with gate coupled to said inverter input and drain coupled to said inverter output;

a second n-channel transistor with gate coupled to said inverter input, drain coupled to source of said first n-channel transistor, and source coupled to ground;

a third n-channel transistor with gate coupled to said voltage controlled delay line cell n-channel bias input, drain coupled to said source of said first n-channel transistor, and source coupled to said ground;

a first p-channel transistor with gate coupled to said inverter input and drain coupled to said inverter output;

a second p-channel transistor with gate coupled to said inverter input, drain coupled to source of said first p-channel transistor, and source coupled to a power supply; and a third p-channel transistor with gate coupled to said voltage controlled delay line cell p-channel bias input, drain coupled to said source of said first p-channel transistor, and source coupled to said power supply.

15. The circuit according to claim 11 wherein said delay cell p-channel bias input is coupled to reference generator p-channel bias.

16. The circuit according to claim 11 wherein said delay cell n-channel bias input is coupled reference generator n-channel bias.

17. The circuit according to claim 11 further comprising additional said delay cells.

* * * * *